United States Patent
Imanishi

(10) Patent No.: US 8,175,128 B2
(45) Date of Patent: May 8, 2012

(54) SEMICONDUCTOR LASER ELEMENT AND SEMICONDUCTOR LASER DEVICE

(75) Inventor: Daisuke Imanishi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 12/657,451

(22) Filed: Jan. 21, 2010

(65) Prior Publication Data
US 2010/0183041 A1    Jul. 22, 2010

(30) Foreign Application Priority Data

Jan. 22, 2009  (JP) ................ P2009-011989

(51) Int. Cl.
*H01S 5/00* (2006.01)

(52) U.S. Cl. .............. 372/45.01; 372/50.11
(58) Field of Classification Search ........ 372/45.01, 372/50.11
See application file for complete search history.

(56) References Cited

U.S. PATENT DOCUMENTS

| | | | |
|---|---|---|---|
| 5,034,958 A | 7/1991 | Kwon et al. | |
| 5,495,493 A | 2/1996 | Kurihara et al. | |
| 2002/0176459 A1* | 11/2002 | Martinsen | 372/34 |
| 2008/0063020 A1* | 3/2008 | Fukuda et al. | 372/45.012 |

FOREIGN PATENT DOCUMENTS

| | | |
|---|---|---|
| JP | 62-104188 | 5/1987 |
| JP | 01-090583 A | 4/1989 |
| JP | 01-282883 A | 11/1989 |
| JP | 05506333 T | 9/1993 |
| JP | 06326413 A | 11/1994 |
| JP | 2809978 A | 5/1995 |
| JP | 2001-015851 A | 1/2001 |
| JP | 2003-008145 A | 1/2003 |
| JP | 2007227860 A * | 9/2007 |

OTHER PUBLICATIONS

Office Action from Japanese Application No. 2009-011989, dated Oct. 28, 2010.

* cited by examiner

*Primary Examiner* — Patrick Stafford
(74) *Attorney, Agent, or Firm* — Lerner, David, Littenberg, Krumholz & Mentlik, LLP

(57) ABSTRACT

A semiconductor laser element is provided which includes a first semiconductor layer, an active layer having a current injection region, a second semiconductor layer, a third semiconductor layer, and an electrode for injecting a current into the active layer. In the semiconductor laser element, the first semiconductor layer, the active layer, the second semiconductor layer, and the third semiconductor layer are laminated in that order on a substrate, the first semiconductor layer has a current constriction layer which constricts the current injection region of the active layer, the third semiconductor layer is formed on an upper surface of the second semiconductor layer in a region corresponding to the current injection region of the active layer, and the electrode is formed on the upper surface of the second semiconductor layer in a region other than that of the third semiconductor layer.

15 Claims, 10 Drawing Sheets

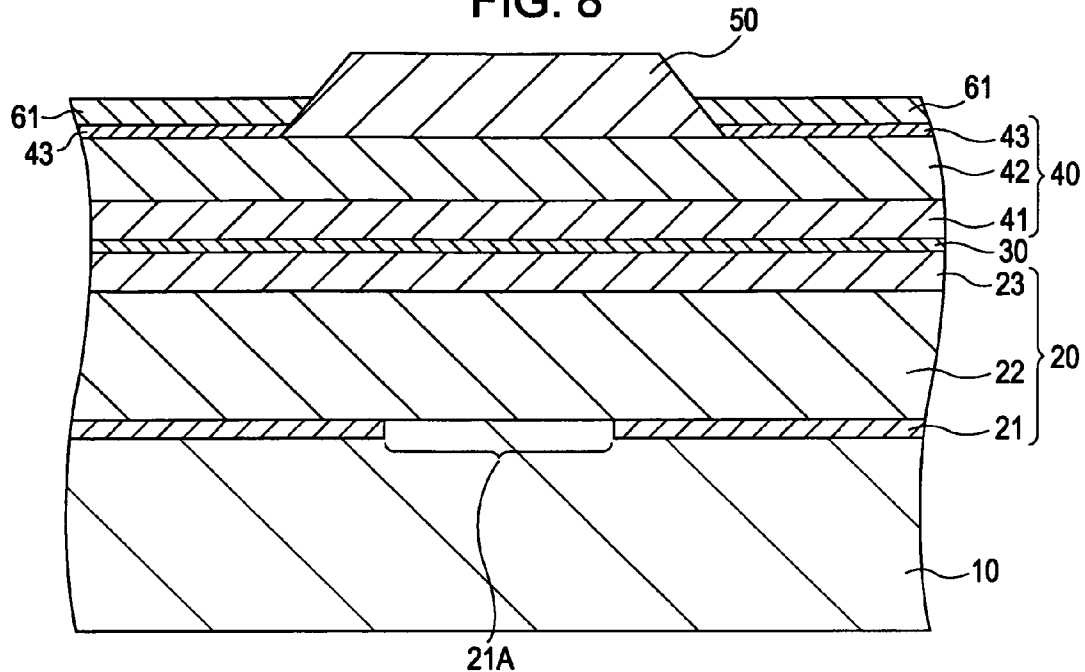
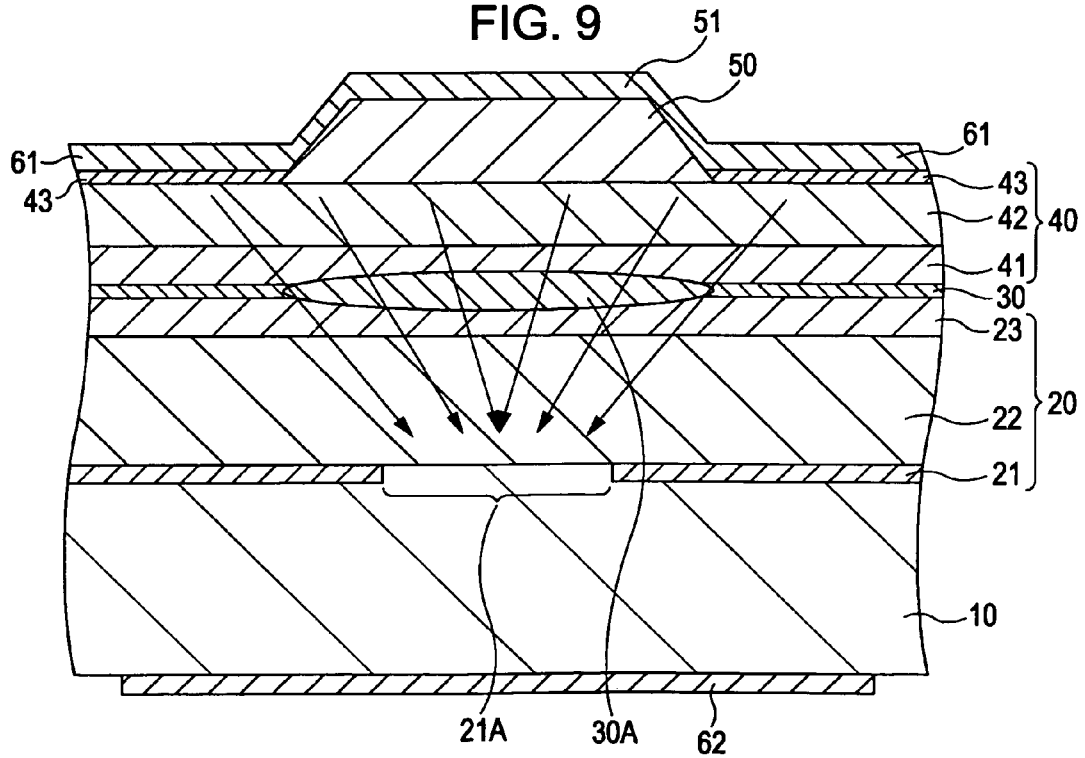

SEMICONDUCTOR LASER ELEMENT AND SEMICONDUCTOR LASER DEVICE

CROSS-REFERENCE TO RELATED APPLICATION

The present application claims priority from Japanese Patent Application No. JP 2009-011989 filed in the Japanese Patent Office on Jan. 22, 2009, the entire content of which is incorporated herein by reference.

BACKGROUND OF THE INVENTION

1. Field of the Invention

The present invention relates to a semiconductor laser element and a semiconductor laser device which includes a support member and the semiconductor laser element mounted thereon.

2. Description of the Related Art

Heretofore, in a semiconductor laser, a ridge for current constriction is formed at an upper portion of a p-type semiconductor layer to increase a current injection efficiency into an active layer.

SUMMARY OF THE INVENTION

However, since the p-side electrode and the p-type semiconductor layer are in contact with each other in a limited area of only an upper portion of the ridge, there has been a problem in that an operation voltage is increased due to an increase in series resistance.

Accordingly, a technique has been proposed in which in a nitride semiconductor laser, a current constriction layer is provided in an n-type semiconductor layer without forming a ridge, and thereby the contact area between a p-side electrode and a p-type semiconductor layer is increased (for example, see Japanese Unexamined Patent Application Publication No. 2003-8145). However, according to the structure of the nitride semiconductor laser described above, penetration of the optical field into the p-type semiconductor layer, which causes free carrier absorption, disadvantageously occurs, and in order to reduce the light absorption loss, the above technique is preferably further improved.

In consideration of the above problems, it is desirable to provide a semiconductor laser element which can reduce the series resistance and a semiconductor laser device including the above semiconductor laser element.

According to an embodiment of the present invention, there is provided a semiconductor laser element which includes: a first semiconductor layer; an active layer having a current injection region; a second semiconductor layer; a third semiconductor layer; and an electrode for injecting a current into the active layer. In the semiconductor laser element described above, the first semiconductor layer, the active layer, the second semiconductor layer, and the third semiconductor layer are laminated in that order on a substrate, the first semiconductor layer has a current constriction layer which constricts the current injection region of the active layer, the third semiconductor layer is formed on an upper surface of the second semiconductor layer in a region corresponding to the current injection region of the active layer, and the electrode is formed on the upper surface of the second semiconductor layer in a region other than that of the third semiconductor layer.

According to an embodiment of the present invention, there is provided a semiconductor laser device which includes a semiconductor laser element and a support member, and this semiconductor laser element is the above-described semiconductor laser element according to an embodiment of the present invention.

In the semiconductor laser element or the semiconductor laser device according to an embodiment of the present invention, since the current constriction layer is provided in the first semiconductor layer, when a predetermined voltage is applied between a pair of electrodes, the current constriction occurs by the current constriction layer, and current is injected into the current injection region of the active layer, so that light emission occurs by electron-hole recombination. Since the third semiconductor layer is formed on the upper surface of the second semiconductor layer in the region corresponding to the current injection region of the active layer, and the electrode is formed in the region other than that described above, the contact area between the electrode and the second semiconductor layer is increased, and as a result, the series resistance can be reduced.

BRIEF DESCRIPTION OF THE DRAWINGS

FIG. 8 is a cross-sectional view illustrating a step following the step shown in FIG. 7;

FIG. 9 is a cross-sectional view showing the structure of a semiconductor laser element according to a second embodiment of the present invention;

DESCRIPTION OF THE PREFERRED EMBODIMENTS

Hereinafter, embodiments of the present invention will be described in detail with reference to the accompanying drawings. The description will be made in the following order.

1. First embodiment (example in which a third semiconductor layer is directly bonded to a submount).
2. Second embodiment (example in which a metal film is formed on the third semiconductor layer).
3. Third embodiment (example in which the third semiconductor layer has a laminate structure including an n-type layer and a non-doped layer).
4. Fourth embodiment (example in which a dielectric multilayer film is formed on the third semiconductor layer).
5. Fifth embodiment (surface emitting laser).
6. Application example <First Embodiment>
<Semiconductor Laser Element>

Figure 1:
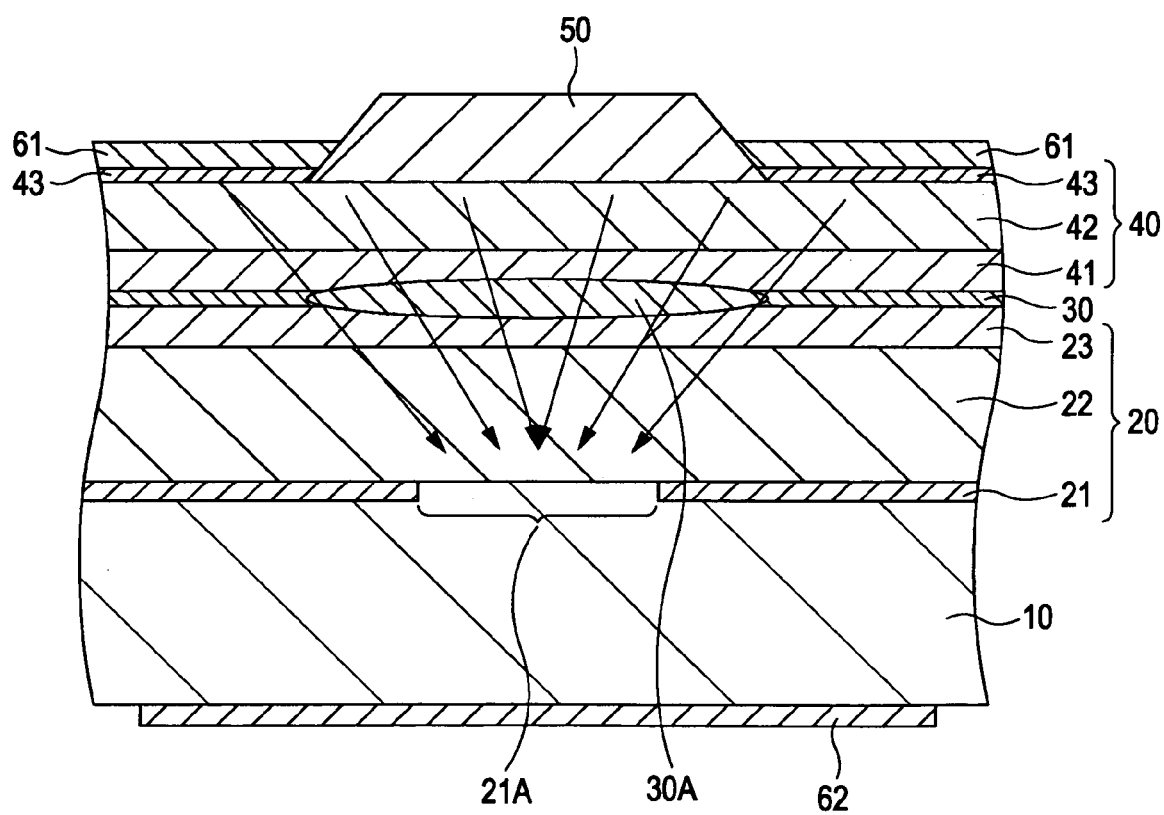
FIG. 1 is a cross-sectional view showing the structure of a semiconductor laser element according to a first embodiment of the present invention.

FIG. 1 is a cross-sectional view showing the structure of a semiconductor laser element 1 according to a first embodiment of the present invention. This semiconductor laser element 1 is used for a laser display or a laser irradiation apparatus, such as a laser machining apparatus, and has a first semiconductor layer 20, an active layer 30, a second semiconductor layer 40, and a third semiconductor layer 50, which are provided in that order on a substrate 10 made of n-type GaAs.

The first semiconductor layer 20 has, for example, a current constriction layer 21, an n-type clad layer 22, and an n-side guide layer 23 in that order from a side of the substrate 10.

The current constriction layer 21 is a layer to constrict a current injection region 30A of the active layer 30, has a thickness of approximately 0.1 μm, and is formed of p-type GaAs doped with a p-type impurity such as zinc (Zn). The current constriction layer 21 has an opening portion 21A corresponding to the current injection region 30A and is configured so that a current passing through the opening portion 21A is injected into the current injection region 30A. In addition, this semiconductor laser element 1 is a so-called broad-area semiconductor laser in which the width of the opening portion 21A is, for example, 10 μm or more and is typically 20 to 400 μm.

The n-type clad layer 22 has a thickness, for example, of 1 μm and is formed of an n-type AlInP mixed crystal doped with an n-type impurity, such as silicon (Si). The n-side guide layer 23 has a thickness, for example, of 0.1 μm and is formed of a non-doped AlGaInP mixed crystal.

The active layer 30 has a thickness, for example, of 10 nm and is formed of a non-doped GaInP mixed crystal. In this active layer 30, a region facing the opening portion 21A of the current constriction layer 21 is used as the current injection region (light emission region) 30A.

The second semiconductor layer 40 has, for example, a p-side guide layer 41, a p-type clad layer 42, and a p-side contact layer 43 in that order from the substrate 10 side.

The p-side guide layer 41 has a thickness, for example, of 0.1 μm and is formed of a non-doped AlGaInP mixed crystal. The p-type clad layer 42 has a thickness, for example, of 0.3 μm and is formed of a p-type AlInP mixed crystal doped with a p-type impurity such as magnesium (Mg). The p-side contact layer 43 has a thickness, for example, of 0.1 μm and is formed of p-type GaAs heavily doped with a p-type impurity such as zinc (Zn). In addition, between the p-type clad layer 42 and the p-side contact layer 43, an etching stopper layer (not shown) and an interlayer (not shown) may be provided. The etching stopper layer may be formed, for example, of a GaInP mixed crystal doped with a p-type impurity such as magnesium (Mg). The interlayer may be formed, for example, of a p-type GaInP mixed crystal doped with a p-type impurity such as magnesium (Mg).

The third semiconductor layer 50 has a belt shape and is formed on an upper surface of the second semiconductor layer 40 in a region corresponding to the current injection region 30A of the active layer 30. In a region on the upper surface of the second semiconductor layer 40 other than that of the third semiconductor layer 50, a p-side electrode 61 for injecting a current into the active layer 30 is formed. Accordingly, in this semiconductor laser element 1, the series resistance can be reduced.

The third semiconductor layer 50 has a thickness, for example, of 0.7 μm and is formed of an AlInp mixed crystal. In addition, the p-side contact layer 43 described above is formed on an upper surface of the p-type clad layer in a region other than that of the third semiconductor layer 50.

The conduction type of the third semiconductor layer 50 may be a p type by addition of a p-type impurity, such as magnesium (Mg), may be an n type by addition of an n-type impurity, such as silicon (Si), or may be a non-doped type. The reason for this is that current is not injected into the third semiconductor layer 50, but only light is confined therein. In particular, the conduction type of the third semiconductor layer 50 is preferably a non-doped type. The reason for this is that since the free carrier absorption caused by carriers of the p-type clad layer is reduced, and the optical loss is reduced, the energy conversion efficiency of laser can be improved, and in particular, the output of a high output laser can be significantly effectively increased.

The p-side electrode 61 is formed by lamination, for example, of titanium (Ti), platinum (Pt), and gold (Au) in that order from a side of the second semiconductor layer 40 and is electrically connected to the p-side contact layer 43.

On the other hand, on the rear surface of the substrate 10, an n-side electrode 62 for injecting a current into the active layer 30 is formed. The n-side electrode 62 has a lamination structure formed, for example, of an alloy of gold (Au) and germanium (Ge), nickel (Ni), and gold (Au) in that order from the substrate 10 side and is electrically connected thereto.

Furthermore, in this semiconductor laser element 1, for example, two side surfaces of the third semiconductor layer 50 located in a longitudinal direction face each other and are used as a pair of resonator end surfaces, and a pair of reflection mirror films (not shown) is formed on the pair of resonator end surfaces. The reflectance of one reflection mirror film is adjusted to decrease, and the reflectance of the other reflection mirror film is adjusted to increase. Accordingly, it is configured that light generated in the active layer 30 is amplified when reciprocating between the pair of reflection mirror films and is then emitted as laser beams from one reflection mirror film. That is, this semiconductor laser element 1 is an edge emitting laser in which light generated from the active layer 30 is emitted in a direction perpendicular to the lamination direction of the first semiconductor layer 20, the active layer 30, the second semiconductor layer 40, and the third semiconductor layer 50.

<Semiconductor Laser Device>

Figure 2:
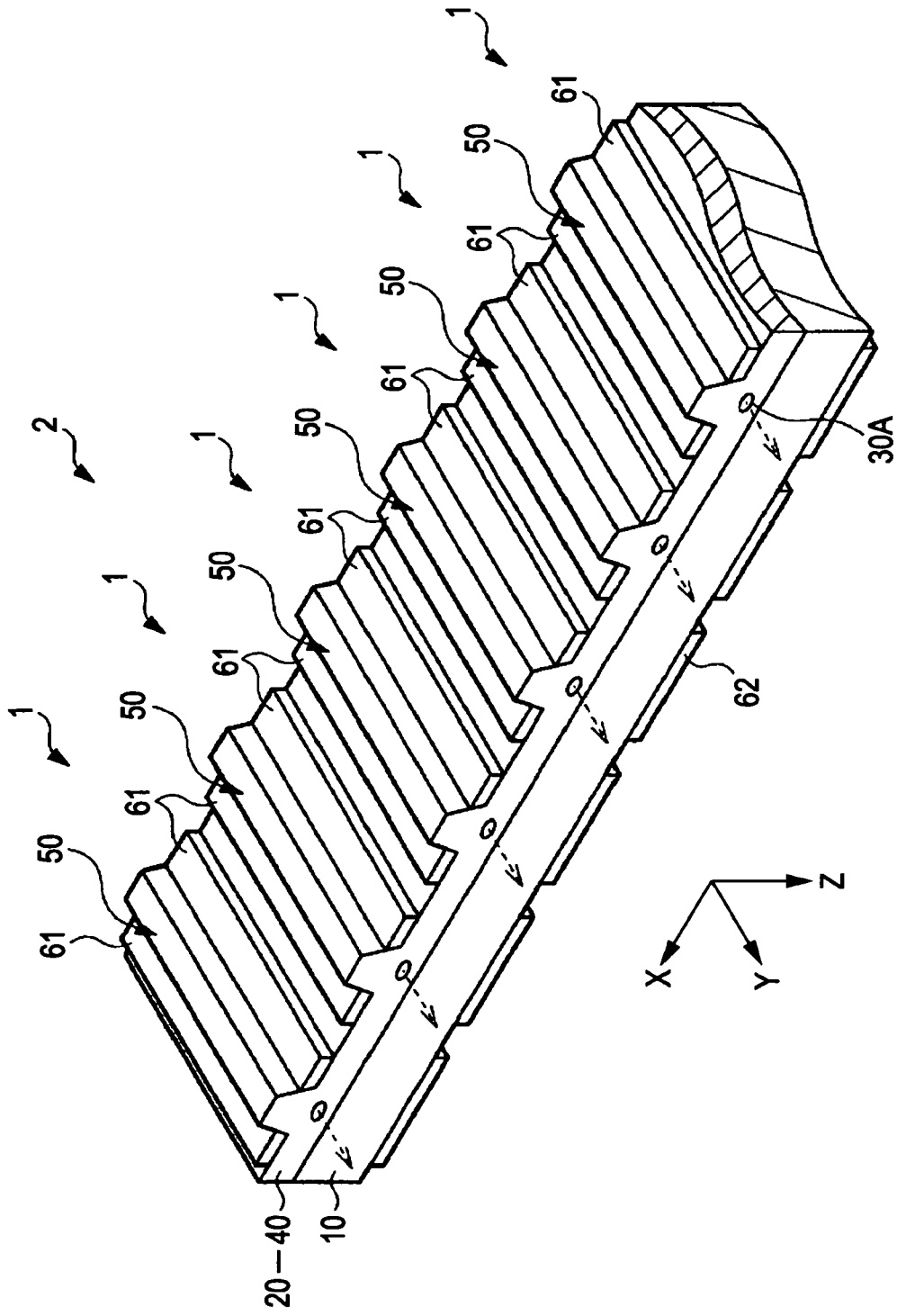
FIG. 2 is a perspective view showing the structure of a semiconductor laser array including a plurality of semiconductor laser elements each shown in FIG. 1.

FIG. 2 is a schematic perspective view showing the structure of a semiconductor laser array 2 including a plurality of semiconductor laser elements 1. In this semiconductor laser array 2, the semiconductor laser elements 1 are monolithically formed on a common substrate 10 so as to obtain an optical output on the order of watt.

In the semiconductor laser array 2, a thermal interaction is liable to occur between adjacent emitters (each corresponding to one semiconductor laser element 1), and hence the emitter distance is preferably set to approximately 400 μm. Accordingly, when the optical output from one emitter increases, the number of emitters can be reduced, and as a result, an optical element which is optically coupled with the semiconductor laser array 2 can be miniaturized, and/or the number of optical elements can be reduced.

Figure 3:
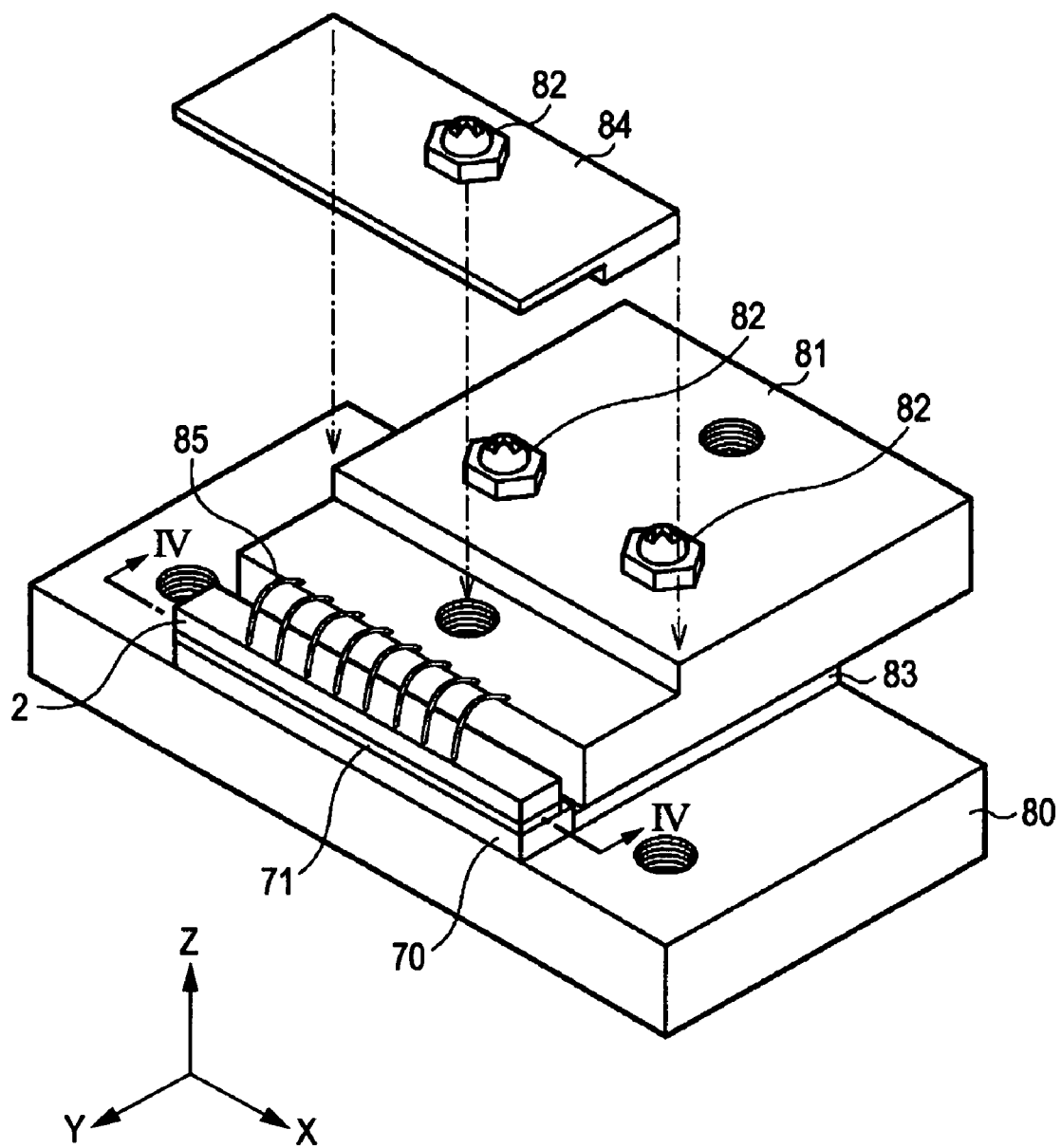
FIG. 3 is a perspective view showing the structure of a semiconductor laser device including the semiconductor laser array shown in FIG. 2.

FIG. 3 is a schematic perspective view sowing the structure of a semiconductor laser device 3 including the semiconductor laser array 2. This semiconductor laser device 3 is used, for example, for laser display, laser machining, or medical application. The semiconductor laser array 2 is bonded, for example, to a submount 70 made of SiC or the like having a high thermal conductivity with a solder layer 71 interposed therebetween. The submount 70 is bonded to a metal-made heat sink 80 with a solder layer 72 (not shown in FIG. 3, and see FIG. 4) interposed therebetween. The semiconductor laser array 2 may also be directly bonded to the heat sink 80 with the solder layer 71 without using the submount 70. In this embodiment, the submount 70 or the heat sink 80 corresponds to one particular example of a "support member" according to an embodiment of the present invention.

An electrode member 81 electrically connected to the n-side electrodes 62 with wires 85 interposed therebetween is provided at a side opposite to a light emission side of the semiconductor laser array 2. This electrode member 81 is fixed on an insulating plate 83 with screws 82, and this insulating plate 83 separates the heat sink 80 from the electrode member 81 for the insulation purpose. A protective member 84 protecting the wires 85 from the outside is fixed on the electrode member 81 with a screw 82.

Figure 4:
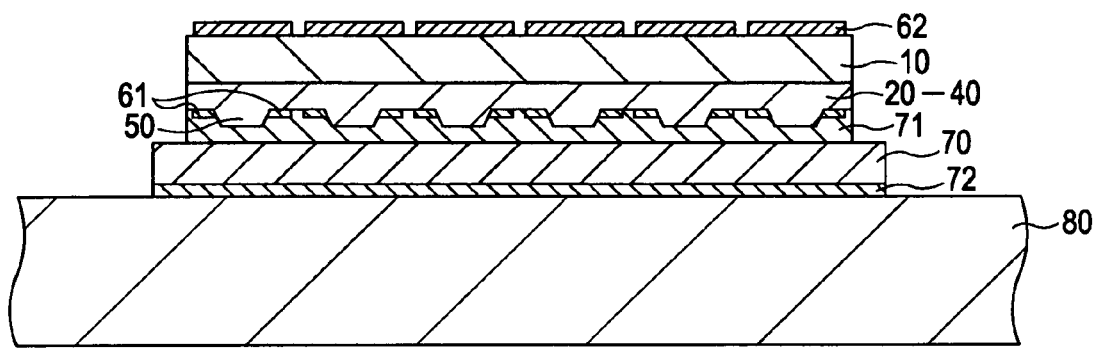
FIG. 4 is a cross-sectional view taken along the ling IV-IV in FIG. 3.

The semiconductor laser array 2 is bonded, for example, to the submount 70 in a junction down manner as shown in FIG. 4. The third semiconductor layers 50 of the individual semiconductor laser elements 1 are bonded to the submount 70 with the solder layer 71 interposed therebetween. Accordingly, heat from the p-type clad layer 42 and the third semiconductor layer 50 can be efficiently removed, and a decrease in energy conversion efficiency caused by heat can be suppressed.

For example, this semiconductor laser element 1 can be manufactured as described below.

Figure 5:
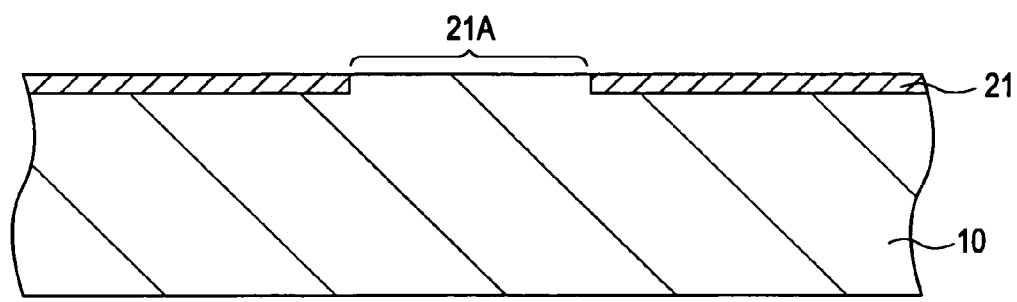
FIG. 5 is a cross-sectional view illustrating a step of a manufacturing method of the semiconductor laser element shown in FIG. 1.

First, as shown in FIG. 5, the substrate 10 which is formed from the aforementioned material is prepared, and the current constriction layer 21 is formed in an upper surface of this substrate 10, for example, by diffusion or ion implantation of zinc (Zn). In particular, ion implantation is preferable since the current constriction layer 21 can be easily formed.

Figure 6:
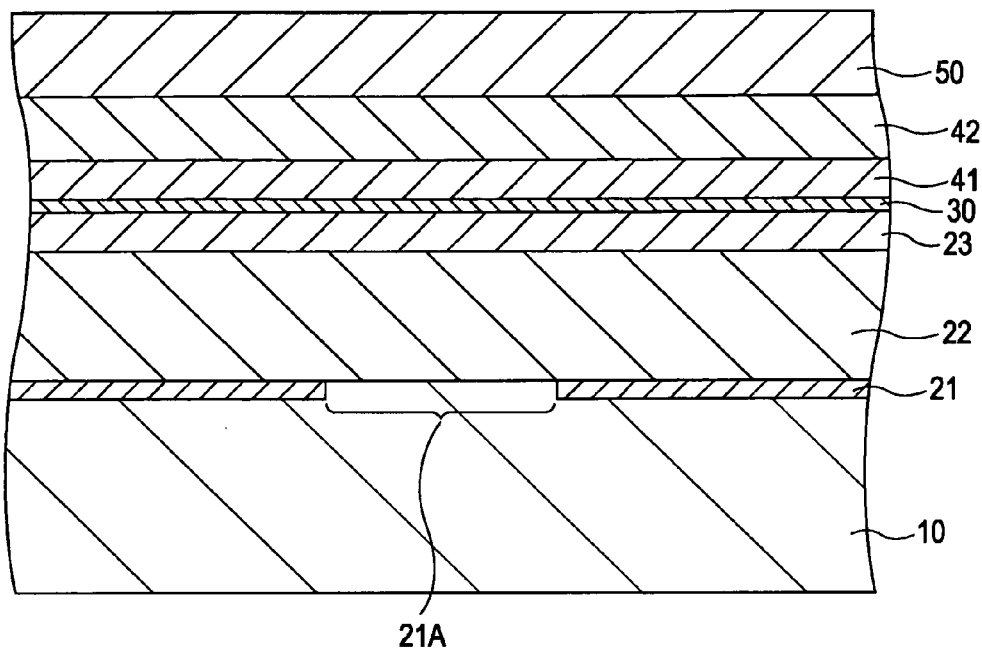
FIG. 6 is a cross-sectional view illustrating a step following the step shown in FIG. 5.

Next, as shown in FIG. 6, the n-type clad layer 22, the n-side guide layer 23, the active layer 30, the p-side guide layer 41, the p-type clad layer 42, and a solid third semiconductor layer film 50, each of which is formed of the aforementioned material and has the aforementioned thickness, are laminated in that order, for example, by a metal organic chemical vapor deposition (MOCVD) method. In this step, as starting materials for compound semiconductors, for example, trimethylaluminum (TMAl), trimethylgallium (TMGa), trimethylindium (TMIn), phosphine ($PH_3$), and arsine ($AsH_3$) are used; as starting materials for donor impurities, for example, monosilane ($SiN_4$) is used; and as starting materials for acceptor impurities, for example, bis(cyclopentadienyl) magnesium (Cp2Mg) and dimethylzinc (DMZn) are used.

Figure 7:
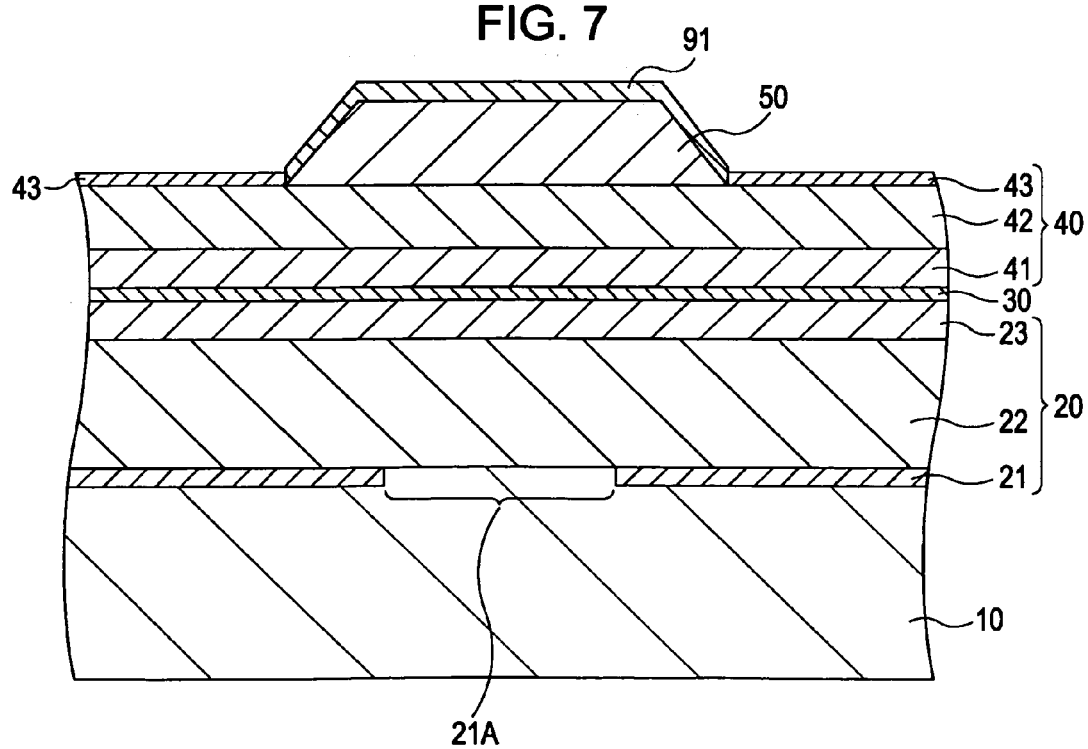
FIG. 7 is a cross-sectional view illustrating a step following the step shown in FIG. 6.

Subsequently, as shown in FIG. 7, the solid third semiconductor layer film 50 is processed by etching or the like to form the third semiconductor layer 150 having a belt shape on the upper surface of the second semiconductor layer 40 in the region corresponding to the current injection region 30A of the active layer 30. Next, also as shown in FIG. 7, a selective growth mask 91 made of $SiO_2$ is formed on an upper surface and side surfaces of the third semiconductor layer 50, for example, by a CVD method, and the p-side contact layer 43 made of the aforementioned material and having the aforementioned thickness is formed.

After the p-side contact layer 43 is formed, as shown in FIG. 8, the selective growth mask 91 is etched off, and for example, by deposition, the p-side electrode 61 made of the aforementioned material is formed on the upper surface of the second semiconductor layer 40 in the region other than that of the third semiconductor layer 50.

In addition, after the rear surface side of the substrate 10 is processed, for example, by lapping and polishing to decrease the thickness of the substrate 10 to approximately 100 μm, the n-side electrode 62 is formed on the rear surface of the substrate 10. Subsequently, the substrate 10 is shaped to have a predetermined size, and the reflection mirror films (not shown) are then formed on the pair of resonator end surfaces which face each other. As a result, the semiconductor laser element 1 shown in FIG. 1 is obtained.

In this semiconductor laser element 1, when a predetermined voltage is applied between the n-side electrode 62 and the p-side electrode 61, a current is injected into the active layer 30, and light emission occurs by electron-hole recombination. The light thus emitted reflects between the pair of reflection mirror films and reciprocates therebetween to generate laser oscillation, and as a result, laser beams are emitted outside. In this embodiment, since the current constriction layer 21 is provided in the first semiconductor layer 20, the current constriction is performed by this current constriction layer 21, and hence a current is injected into the current injection region 30A of the active layer 30. In addition, since the third semiconductor layer 50 is formed on the upper surface of the second semiconductor layer 40 in the region corresponding to the current injection region 30A of the active layer 30, and the p-side electrode 61 is formed in the region other than that described above, the contact area between the p-side electrode 61 and the second semiconductor layer 40 is increased, and hence the series resistance can be reduced.

In this embodiment, as described above, the current constriction layer 21 is provided in the first semiconductor layer 20, the third semiconductor layer 50 is formed on the upper surface of the second semiconductor layer 40 in the region corresponding to the current injection region 30A of the active layer 30, and the p-side electrode 61 is formed in the region other than that described above; hence, the series resistance can be reduced, and an increase in operation voltage can be suppressed. In addition, since the energy conversion efficiency of laser can be improved, the reliability can be improved, the control range of operation temperature can be increased, and a high temperature operation can be performed.

<Second Embodiment>

FIG. 9 is a cross-sectional view showing the structure of a semiconductor laser element 1A according to a second embodiment of the present invention. In this embodiment, except that a metal film 51 is formed on the third semiconductor layer 50, this semiconductor laser element 1A can be formed in a manner similar to that of the first embodiment so as to have similar structure, performances, and advantages to those of the first embodiment.

The metal film 51 is formed of the same material as that of the p-side electrode 61 and can be formed by the same process as that for the p-side electrode 61. Since the metal film 51 is formed on the third semiconductor layer 50, bonding characteristics to the solder layer 71 are improved, and hence heat can be effectively removed.

In this case, the conduction type of the third semiconductor layer 50 is preferably an n type or a non-doped type. The reason for this is that a Schottky barrier between the p-side electrode 61 and the third semiconductor layer 50 can be increased so as to prevent a current from flowing into the third semiconductor layer 50. In particular, the conduction type of the third semiconductor layer 50 is preferably a non-doped type. The reason for this is that since the free carrier absorption caused by carriers of the p-type clad layer is reduced, and the optical loss is reduced, the energy conversion efficiency of laser can be improved, and in particular, the output of a high output laser can be significantly effectively increased.

<Third Embodiment>

Figure 10:
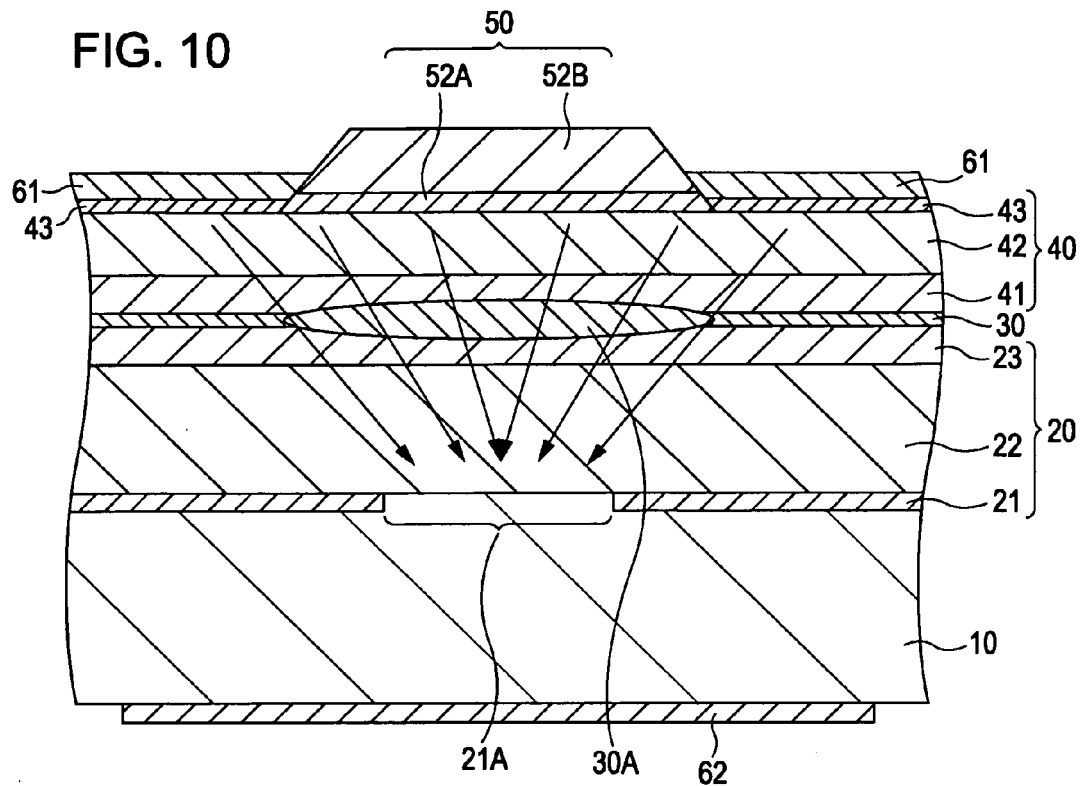
FIG. 10 is a cross-sectional view showing the structure of a semiconductor laser element according to a third embodiment of the present invention.

FIG. 10 is a cross-sectional view showing the structure of a semiconductor laser element 1B according to a third embodiment of the present invention. In this embodiment, except that the third semiconductor layer 50 is formed to have a lamination structure of an n-type layer 52A and a non-doped layer 52B, this semiconductor laser element 1B can be formed in a manner similar to that of the first embodiment so as to have similar structure, performances, and advantages to those of the first embodiment.

The n-type layer 52A forms a pn junction with the p-type clad layer 42 and suppresses diffusion of carriers to the non-doped layer 52B. In addition, the n-type layer 52A is formed, for example, of an AlInP mixed crystal doped with an n-type impurity, such as silicon (Si), and has a thickness of 0.1 µm. The non-doped layer 52B is formed, for example, of a non-doped AlInP mixed crystal having a thickness of 0.6 µm. When the third semiconductor layer 50 is formed to have a lamination structure of the n-type layer 52A and the non-doped layer 52B, the free carrier absorption in the non-doped layer 52B can be reliably suppressed.

<Fourth Embodiment>

Figure 11:
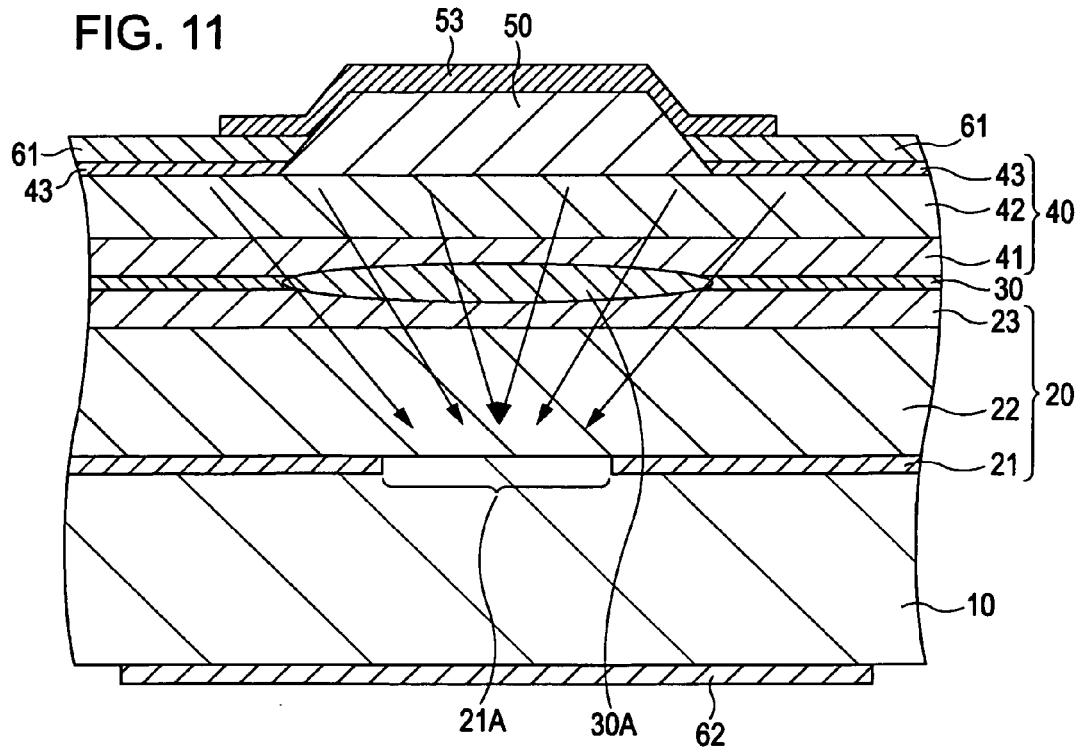
FIG. 11 is a cross-sectional view showing the structure of a semiconductor laser element according to a fourth embodiment of the present invention.

FIG. 11 is a schematic cross-sectional view showing the structure of a semiconductor laser element 1C according to a fourth embodiment of the present invention. In this embodiment, except that light absorption caused at the solder layer 71 is reduced by forming a dielectric multilayer film 53 on the third semiconductor layer 50, this semiconductor laser element 1C can be formed in a manner similar to that of the first embodiment so as to have similar structure, performances, and advantages to those of the first embodiment.

<Fifth Embodiment>

Figure 12:
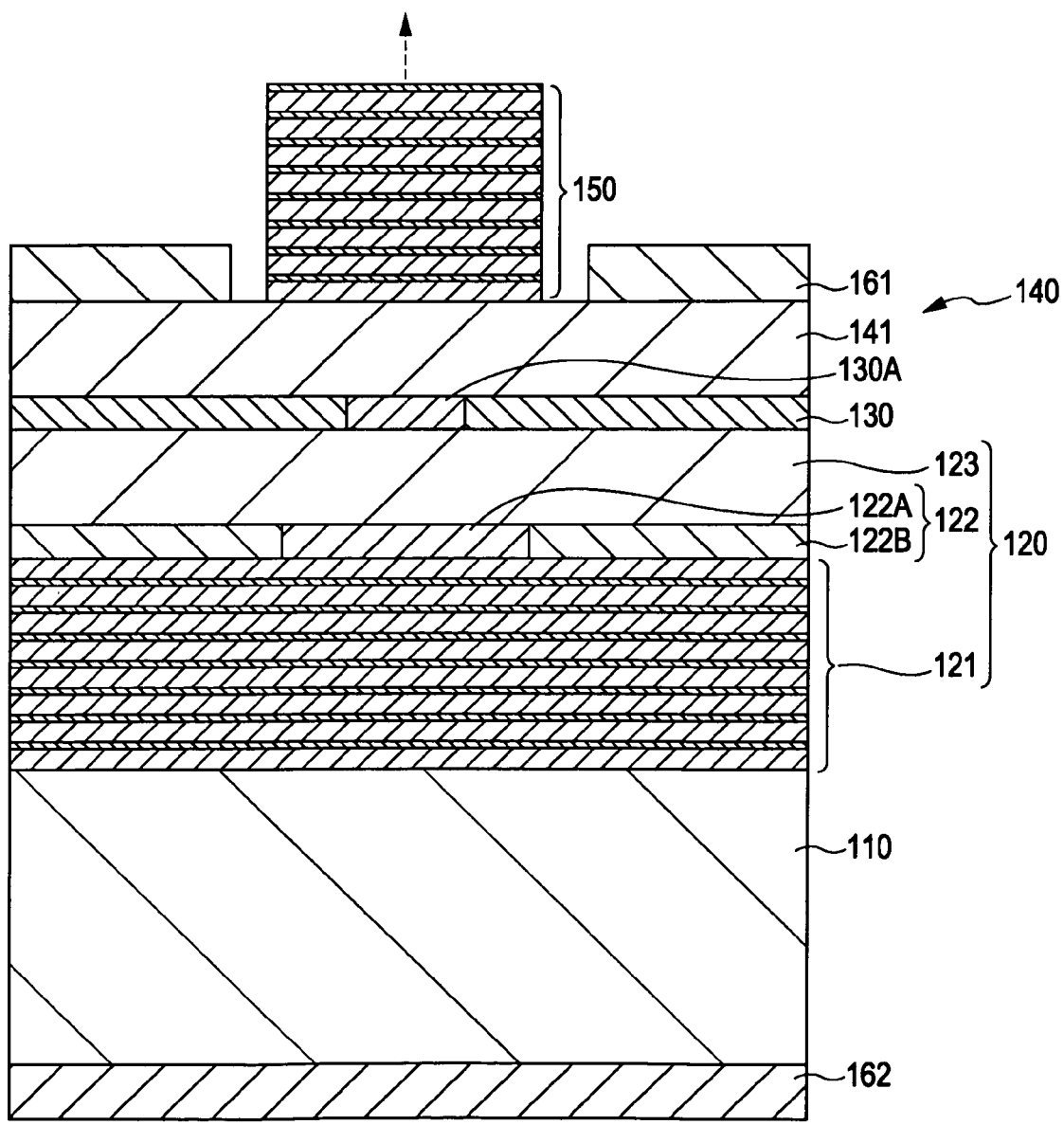
FIG. 12 is a cross-sectional view showing the structure of a semiconductor laser element according to a fifth embodiment of the present invention.

FIG. 12 is a schematic cross-sectional view showing the structure of a semiconductor laser element 1D according to a fifth embodiment of the present invention. This semiconductor laser element 1D is a surface emitting laser which includes a first semiconductor layer 120, an active layer 130, a second semiconductor layer 140, and a third semiconductor layer 150 provided in that order on a substrate 110 made of n-type GaAs.

The first semiconductor layer 120 has an n-side distributed Bragg reflector (DBR) layer 121, a current constriction layer 122, and an n-side guide layer 123. The n-side DBR layer 121 has a multilayer structure formed, for example, of an n-type AlGaAs mixed crystal. The current constriction layer 122 has a low resistance region 122A of aluminum arsenide (AlAs) and a high resistance region 122B of oxidized aluminum arsenide provided around the low resistance region 122A and is configured so that a current is constricted only by the low resistance region 122A. The n-side guide layer 123 is formed, for example, of an n-type AlGaAs mixed crystal.

The active layer 130 is formed, for example, of GaAs doped with no impurity, and a region of the active layer 130 corresponding to the low resistance region 122A is a light emission region (current injection region) 130A.

The second semiconductor layer 140 has a p-side guide layer 141. The p-side guide layer 141 is formed, for example, of a p-type AlGaAs mixed crystal.

The third semiconductor layer 150 is a DBR layer having a multilayer structure formed, for example, of an AlGaAs mixed crystal. The third semiconductor layer 150 is formed on an upper surface of the second semiconductor layer 140 in a region corresponding to the current injection region 130A of the active layer 130 to have a cylindrical shape and is configured so that light generated in the active layer 130 is emitted in a direction perpendicular to an upper surface of the third semiconductor layer 150. A p-side electrode 161 for injecting a current into the active layer 130 is formed on the upper surface of the second semiconductor layer 140 in a region other than that of the third semiconductor layer 150. Accordingly, in this semiconductor laser element 1D, the series resistance can be reduced.

The conduction type of the third semiconductor layer 150 may be a p type by addition of a p-type impurity, such as magnesium (Mg), may be an n type by addition of an n-type impurity, such as silicon (Si), or may be a non-doped type. The reason for this is that current is not injected into the third semiconductor layer 150, but only light is reflected thereby. In particular, the conduction type of the third semiconductor layer 150 is preferably a non-doped type. The reason for this is that since the free carrier absorption caused by carriers of a p-type DBR layer is reduced, and the optical loss is reduced, the energy conversion efficiency of laser can be improved, and in particular, the output of a high output laser can be significantly effectively increased.

The p-side electrode 161 is formed by lamination, for example, of titanium (Ti), platinum (Pt), and gold (Au) in that order from a side of the second semiconductor layer 140 and is electrically connected to the p-side guide layer 141.

On the rear surface of the substrate 110, an n-side electrode 162 for injecting a current into the active layer 130 is formed. The n-side electrode 162 has a lamination structure formed, for example, of an alloy of gold (Au) and germanium (Ge), nickel (Ni), and gold (Au) in that order from a side of the substrate 110 and is electrically connected thereto.

For example, this semiconductor laser element 1D can be formed as described below.

First, the n-side DBR layer 121, an aluminum arsenide layer 122C to be formed into the current constriction layer 122, the n-side guide layer 123, the active layer 130, the p-side guide layer 141, and a solid third semiconductor layer film 150 are formed in that order on the substrate 110 made of the aforementioned material by crystal growth or the like.

Next, the solid third semiconductor layer film 150 is processed by etching or the like to form the third semiconductor layer 150 having a cylindrical shape on the upper surface of the second semiconductor layer 140 in the region corresponding to the current injection region 130A of the active layer 130.

Subsequently, the p-side guide layer 141, the active layer 130, the n-side guide layer 123, the aluminum arsenide layer 122, and the n-side DBR layer 121 are selectively removed, for example, by etching, so that a mesa portion (not shown) is formed.

Subsequently, the aluminum arsenide layer 122C exposed at side surfaces of the mesa portion (not shown) is oxidized, for example, by heating in a water vapor atmosphere. Since the oxidation annularly proceeds from the periphery to the center of the aluminum arsenide layer 122C, when the oxidation is stopped at an appropriate timing, the annular high resistance region 122B is formed, and the central portion which is not oxidized functions as the low resistance region 122A. As a result, the current constriction layer 122 having the low resistance region 122A and the high resistance region 122B is formed.

After the current constriction layer 122 is formed, the p-side electrode 161 is formed on the upper surface of the second semiconductor layer 140 in the region other than that of the third semiconductor layer 150, and the n-side electrode 162 is formed on the rear side of the substrate 110. Accordingly, the semiconductor laser element 1D shown in FIG. 12 is obtained.

In this semiconductor laser element 1D, when a predetermined voltage is applied between the n-side electrode 162 and the p-side electrode 161, a drive current supplied from the n-side electrode 162 is constricted by the current constriction layer 122 and is then injected into the active layer 130, and as a result, light emission occurs by electron-hole recombination. The light thus emitted reflects at the n-side DBR layer 121 and the third semiconductor layer 150 and reciprocates therebetween to generate laser oscillation, and as a result, laser beams are emitted outside from the upper surface of the third semiconductor layer 150.

In a related surface emitting laser, since a p-type DBR layer is a high resistance region, there has been a serious problem in that a high speed device operation is difficult to perform. However, in this embodiment, since the third semiconductor layer 150 is formed on the upper surface of the second semiconductor layer 140 in the region corresponding to the current injection region 130A of the active layer 130, and the p-side electrode 161 is formed in the region other than that described above, no current flows through the third semiconductor layer 150, but only reflection of light is performed thereby. Hence, the semiconductor laser element 1D only has a significantly low series resistance component, and as a result, a high speed operation can be performed.

As described above, in this embodiment, since the third semiconductor layer 150 is formed on the upper surface of the second semiconductor layer 140 in the region corresponding to the current injection region 130A of the active layer 130, and the p-side electrode 161 is formed in the region other than that described above, no current flows through the third semiconductor layer 150, the series resistance can be reduced, and a high speed operation can be performed.

<Application Examples>

The semiconductor laser array 2 and the semiconductor laser device 3 shown in FIGS. 2 and 4, respectively, are each mounted in a module (not shown) in a nitrogen atmosphere, whenever necessary, and are each used as a light source of a laser display or a laser irradiation apparatus. For example, in the laser display, laser light emitted from the module is collimated by a lens or the like, is spatially modulated by an optical element in accordance with two-dimensional image information, and is then radiated on a screen. As the optical element, for example, a liquid crystal or an optical micro electro mechanical system (MEMS), such as a digital light processing (DLP) system or grating light valve (GLV) system, may be used.

(Laser Display)

Figure 13:
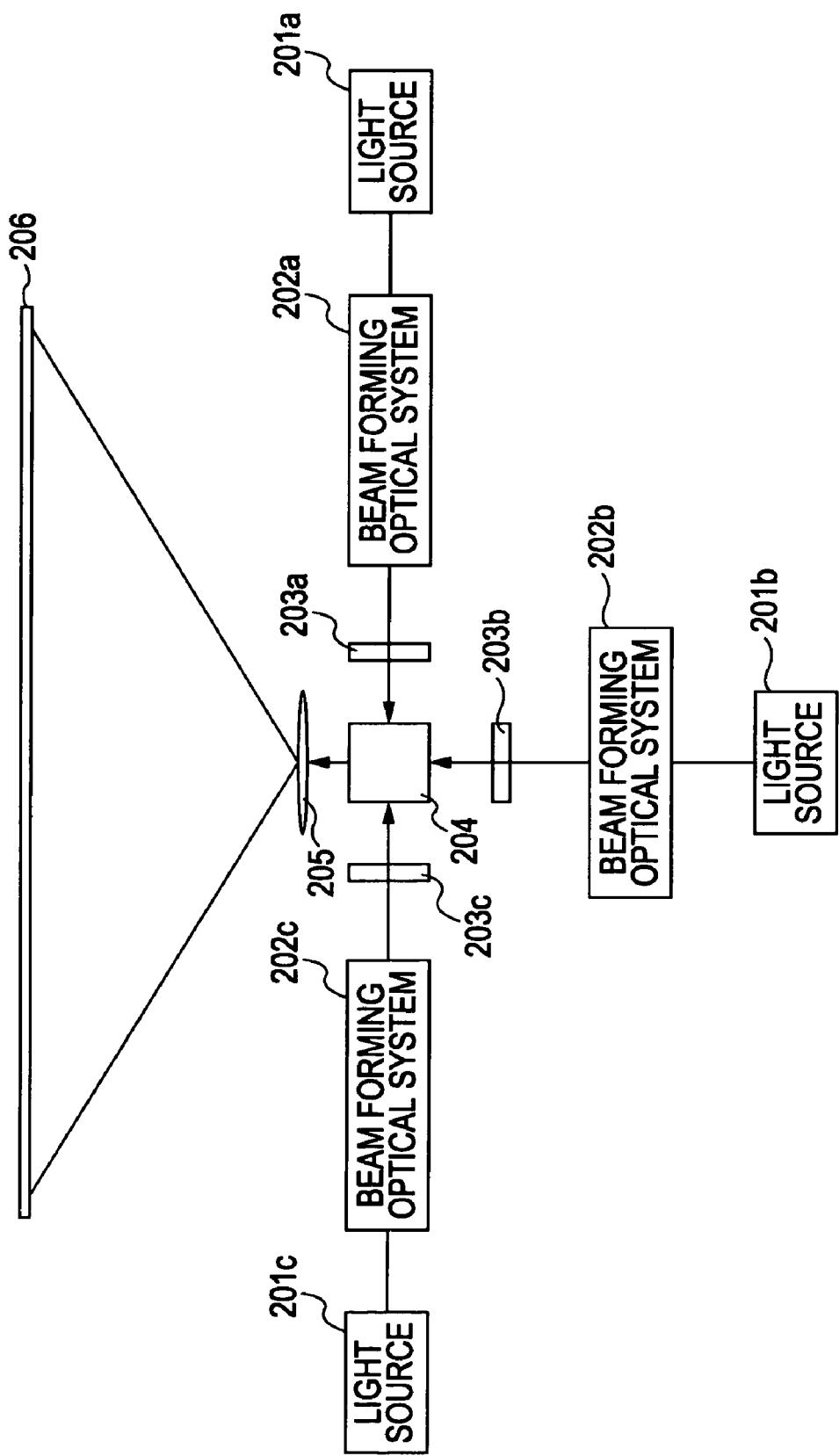
FIG. 13 is a view showing the structure of a laser display apparatus according to one application example of the present invention.

FIG. 13 is a view showing an application example in which the broad-area semiconductor laser array 2 according to the embodiment of the present invention is applied to a laser display apparatus 200. This laser display apparatus 200 includes light sources 201a, 201b, and 201c emitting light beams, red (R), green (G), and blue (B), respectively, and as the light source 201a emitting a red color, the semiconductor laser array 2 according to this embodiment is disposed. This laser display apparatus 200 further includes beam forming optical systems 202a, 202b, and 202c, and liquid crystal panels 203a, 203b, and 203c, which are provided to the light sources 201a, 201b, and 201c, respectively; a cross prism 204; a projection 205; and a projection screen 206.

In this laser display apparatus 200, after light beams emitted from the light sources 201a, 201b, and 201c of RGB colors pass through the beam forming optical systems 202a, 202b, and 202c, respectively, the light beams are incident on the respective liquid crystal panels 203a, 203b, and 203c and are spatially modulated to image information of RGB. Subsequently, the image information of RGB is synthesized by the cross prism 204 and is then projected on the projection screen 206 through the projection 205.

(Laser Irradiation Apparatus)

Figure 14:
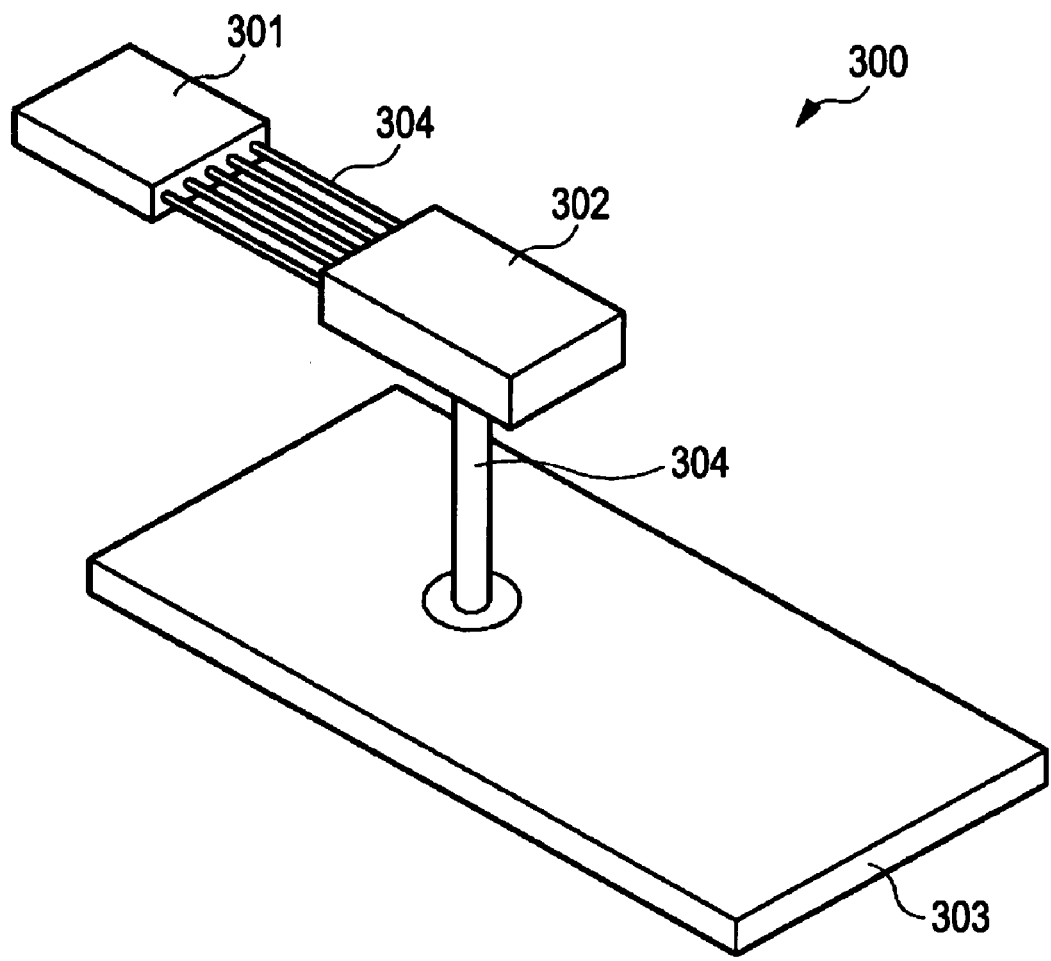
FIG. 14 is a schematic perspective view showing the structure of a laser irradiation apparatus according to one application example of the present invention.

FIG. 14 is a schematic perspective view showing one application example in which the semiconductor laser device 3 according to the embodiment of the present invention is applied to a light source of a laser machining apparatus which is one example of the laser irradiation apparatus. In a laser irradiation apparatus 300 of this embodiment, laser light beams 304 emitted from a light source 301 are combined together at the surface of a workpiece 303 through an optical system 302, so that machining is performed. Since the near field pattern (NFP) of a broad-area semiconductor laser having a large-width ridge is a rectangular shape, the beam pattern combined at the surface of the workpiece 303 also has a rectangular shape. Hence, in the case of machining of a rectangular and/or a line shape, the beam use efficiency is increased. In addition, this laser irradiation apparatus 300 may also applied to surface modification and inspection as well as to laser machining.

Heretofore, although the present invention has been described with reference to the embodiments, the present invention is not limited thereto and may be variously modified. For example, the materials and thicknesses of the individual layers described in the above embodiments, or the film forming methods and film forming conditions described above are not limited, and other materials and thicknesses, or other film forming methods and film forming conditions may also be used.

In addition, in the above embodiments, although the structures of the semiconductor laser element 1, the semiconductor laser array 2, and the semiconductor laser device 3 are particularly described, some of the layers described above may not be formed in some cases, and/or another layer may be further formed.

In addition, in the above embodiments, although the present invention has been described using an AlGaInP-based compound semiconductor laser by way of example, the present invention may also be applied to other compound semiconductor lasers, and as the other compound semiconductor lasers, for example, there may be mentioned an infrared semiconductor laser, such as a GaInAsP-based laser; a gallium nitride semiconductor laser, such as a GaInN-based or a AlGaInN-based laser; and a II-VI semiconductor laser including at least two of Be, Zn, Mg, Cd, S, Se, and Te in combination. In addition, the present invention may also be applied to a semiconductor laser, such as an AlGaAs-based, an InGaAs-based, an InP-based, and a GaInAsNP-based laser, in which the oscillation wavelength is not limited in a visible band. In particular, since the conduction type of the third semiconductor layer 50 can be made an n type or a non-doped type, when the present invention is applied to a material system in which a p type conduction is difficult to obtain (such as a II-VI compound semiconductor), the third semiconductor layer 50 may be used as an optical waveguide structure which is not relating to the current injection, and hence the present invention may be applied, for example, to a green laser technique.

In addition, in the embodiments and the like described above, the present invention has been described using a semiconductor laser having an index guide structure by way of example; however, the present invention is not limited thereto and may also be applied to a semiconductor laser having another structure, such as a gain guide structure.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser element comprising:
a first semiconductor layer;
an active layer having a current injection region;
a second semiconductor layer;
a third semiconductor layer; and
an electrode for injecting a current into the active layer,
wherein the first semiconductor layer, the active layer, the second semiconductor layer, and the third semiconductor layer are laminated in that order on a substrate,
the first semiconductor layer has a current constriction layer which constricts the current injection region of the active layer, the current constriction layer having a doping other than that of a portion of the first semiconductor layer further from the substrate than the current constriction layer, said current constriction layer having an opening portion with a predetermined width in a region corresponding to the current injection region of the active layer such that during operation a current passing through the opening portion is injected into the current injection region of the active layer,
the third semiconductor layer is formed on an upper surface of the second semiconductor layer in a region corresponding to the current injection region of the active layer, and
the electrode is formed on the upper surface of the second semiconductor layer in a region other than that of the third semiconductor layer.

2. The semiconductor laser element according to claim 1, wherein the substrate and the first semiconductor layer each have an n-type conduction, the second semiconductor layer has a p-type conduction, and the third semiconductor layer has an n-type conduction.

3. The semiconductor laser element according to claim 1, wherein the third semiconductor layer is a non-doped layer.

4. The semiconductor laser element according to claim 1, wherein the substrate and the first semiconductor layer each have an n-type conduction, the second semiconductor layer has a p-type conduction, and the third semiconductor layer has a laminate structure in which an n-type layer and a non-doped layer are laminated in that order from a side of the second semiconductor layer.

5. The semiconductor laser element according to one of claims 1 to 4,
wherein the third semiconductor layer is formed to have a belt shape which corresponds to the shape of the current injection region, and
light generated in the active layer is emitted in a direction perpendicular to the lamination direction of the first semiconductor layer, the active layer, the second semiconductor layer, and the third semiconductor layer.

6. The semiconductor laser element according to one of claims 1 to 3,
wherein the first semiconductor layer includes a DBR layer,
the third semiconductor layer is a cylindrical DBR layer, and
light generated in the active layer is emitted in a direction perpendicular to an upper surface of the third semiconductor layer.

7. A semiconductor laser device comprising:
a semiconductor laser element; and
a support member,
wherein the semiconductor laser element includes:
a first semiconductor layer;
an active layer having a current injection region;
a second semiconductor layer;
a third semiconductor layer; and
an electrode for injecting a current into the active layer,
wherein the first semiconductor layer, the active layer, the second semiconductor layer, and the third semiconductor layer are laminated in that order on a substrate,
the first semiconductor layer has a current constriction layer which constricts the current injection region of the active layer, the current constriction layer having a doping other than that of a portion of the first semiconductor layer further from the substrate than the current constriction layer, said current constriction layer having an opening portion with a predetermined width in a region corresponding to the current injection region of the active layer such that during operation a current passing through the opening portion is injected into the current injection region of the active layer,
the third semiconductor layer is formed on an upper surface of the second semiconductor layer in a region corresponding to the current injection region of the active layer, and
the electrode is formed on the upper surface of the second semiconductor layer in a region other than that of the third semiconductor layer, and
the third semiconductor layer and the support member are bonded to each other with a solder layer interposed therebetween.

8. The semiconductor laser device according to claim 7, wherein the semiconductor laser element further includes a metal film formed of the same material as that of the electrode on the third semiconductor layer.

9. The semiconductor laser device according to claim 7, wherein the semiconductor laser element further includes a dielectric multilayer film on the third semiconductor layer.

10. The semiconductor laser element according to claim 1, wherein the predetermined width is 10 µm or more.

11. The semiconductor laser device according to claim 7, wherein the predetermined width is 10 µm or more.

12. The semiconductor laser element according to claim 1, wherein the third semiconductor layer has two side surfaces which face each other and which are utilized as a pair of resonator end surfaces.

13. The semiconductor laser element according to claim 12, wherein a pair of reflection mirror films are formed on the pair of resonator end surfaces.

14. The semiconductor laser device according to claim 7, wherein the third semiconductor layer has two side surfaces which face each other and which are utilized as a pair of resonator end surfaces.

15. The semiconductor laser device according to claim 14, wherein a pair of reflection mirror films are formed on the pair of resonator end surfaces.

* * * * *